United States Patent [19]

Owens

[11] Patent Number: 5,508,618
[45] Date of Patent: Apr. 16, 1996

[54] CORELESS DETECTOR FOR IGNITION DISCHAGE CURRENT

[75] Inventor: David N. Owens, Smithville Flats, N.Y.

[73] Assignee: Simmonds Precision Engine Systems, Akron, Ohio

[21] Appl. No.: 92,146

[22] Filed: Jul. 15, 1993

[51] Int. Cl.⁶ .................................................. F02P 17/00
[52] U.S. Cl. ........................... 324/402; 324/399; 324/395; 324/126; 324/127; 324/117 R
[58] Field of Search .................................... 324/402, 399, 324/395, 126, 117 R, 127

[56] References Cited

U.S. PATENT DOCUMENTS

| | | | |
|---|---|---|---|
| 2,645,751 | 7/1953 | Byerlay | 324/15 |
| 3,324,393 | 6/1967 | Casey et al. | 324/96 |
| 3,793,584 | 2/1974 | Liebermann et al. | 324/399 |
| 4,799,005 | 1/1989 | Fernandes | 324/127 |
| 5,065,073 | 11/1991 | Frus | 315/209 R |
| 5,155,437 | 10/1992 | Frus | 324/399 |
| 5,317,267 | 5/1994 | Miyata et al. | 324/402 |

FOREIGN PATENT DOCUMENTS

| | | |
|---|---|---|
| 2105042 | 3/1994 | Canada. |
| 0362014A1 | 9/1989 | European Pat. Off.. |
| 0468253A3 | 5/1991 | European Pat. Off.. |
| 693911 | 4/1930 | France. |
| 1046501 | 12/1953 | France. |
| 3735234A1 | 10/1966 | Germany. |
| 1227731 | 10/1966 | Germany ............... 324/399 |
| 4132285A1 | 4/1992 | Germany. |
| 2083308 | 3/1982 | United Kingdom. |

OTHER PUBLICATIONS

Copy of European Search Report dated Apr. 3, 1995.
Abstract for Japanese Patent No. A–58131573 dated Aug. 5, 1983.
Abstract for Japanese Patent No. A–4298685 dated Oct. 22, 1992.

Primary Examiner—Kenneth A. Wieder
Assistant Examiner—Kourosh Cyrus Khosravi
Attorney, Agent, or Firm—Leonard L. Lewis; William E. Zitelli

[57] ABSTRACT

In combination, a gas turbine engine ignition system exciter, an igniter, a conductor that connects the exciter to the igniter to form a discharge circuit, and a current pulse detector for detecting current pulses in the circuit, the detector comprising a wire disposed in close proximity to a current carrying element in the circuit so that a sense current is induced in the wire across a coreless gap; the detector further comprising a signal conditioning circuit for converting the sense current to an output that indicates occurrence of a spark discharge.

5 Claims, 1 Drawing Sheet

CORELESS DETECTOR FOR IGNITION DISCHAGE CURRENT

BACKGROUND OF THE INVENTION

The invention relates generally to ignition systems, and more particularly to apparatus and methods for detecting the occurrence of spark discharges across an igniter.

Conventional ignition systems are well known and typically include an exciter having an energy storage device such as a capacitor and an circuit for charging the capacitor, one or more igniter plugs, and a switching mechanism connected between the capacitor and the igniter. In aerospace applications, the switching mechanism commonly is a spark gap, or more recently solid state switches such as SCRs. A control circuit is also provided to control when the switching mechanism is triggered so that the energy stored in the capacitor can be discharged across the igniter gap. During the time that the switching device is open, the capacitor is charged by the charging circuit.

It is often desirable to know whether the ignition system is operating properly, particularly to know if the spark rate is being maintained. For example, spark rates can be significantly affected by operating temperature excursions or variations of input voltage or frequency. Also, various failure modes within the discharge circuits can prevent proper discharge of current through the igniter. Accordingly, many ignition diagnostic systems use a current transformer to detect discharge current flowing to the igniter, typically through the high tension lead or return lead. The current transformer includes a wire coil on a high permeability core that surrounds the current lead. Discharge current through the ignition system cables induces a current in the transformer that can then be analyzed by the diagnostic system because the induced current is related to the occurrence of a spark and current discharge. The current transformer provides a way to detect not only the occurrence of a discharge, but also the corresponding energy level and duration of the discharges.

Although known current pulse detection techniques are useful, they often times are more sophisticated than what the customer needs for diagnostic purposes. In many situations, the only information needed is that a spark discharge occurred. A spark is typically characterized by a high frequency current discharge from the exciter through the high tension lead and plug. Also, current transformers and similar devices have an iron or other heavy core which usually requires a fixed mounting of the detector and adds weight to the overall ignition system and engine. In aerospace applications in particular, unnecessary weight is highly undesirable. Consequently, some engine manufacturers specify that the current detectors not be included in the ignition system. This results in more costly and time intensive ground based testing, often without the temperature, engine, pressure or other factor that caused the engine problem in the first place. Furthermore, the use of a transformer with core can be very restrictive as to where the detector can be positioned in the engine, as well as where in the ignition system the discharge current can be detected. In some applications, it is desirable to know whether failure of proper current discharge is due to a problem in the exciter, the cable leads or the igniter. Current transformers and similar devices with cores are very difficult to position near the igniter, for example.

The need exists, therefore, for a pulsed current detector that can be conveniently used as an add-on feature for an ignition system, if desired, and that can simply provide a go/no-go indication of spark discharges without a significant weight increase. Such a detector also should be able to be disposed conveniently at different locations in the system such as at different points along the cable leads or at the igniter, for example.

SUMMARY OF THE INVENTION

Accordingly, the present invention contemplates, in one embodiment, the combination of an exciter, an igniter, a conductor that connects the exciter to the igniter to form a discharge circuit, and a current pulse detector for detecting current pulses in the circuit, the detector comprising a wire disposed in close proximity to a current carrying element in the circuit so that a sense current is induced in the wire across a coreless gap; the detector further comprising means for converting the sense current to an output that indicates occurrence of a spark discharge.

The invention further contemplates the methods embodied in the use of such apparatus, as well as a method for detecting current discharges in an ignition circuit comprising the steps of:

a. positioning a conductor in close proximity to a discharge current carrying element in the circuit;

b. using discharge current to induce a sense current in the conductor across a coreless gap; and c. converting the sense current into an output signal that indicates occurrence of current discharges.

These and other aspects and advantages of the present invention will be readily understood and appreciated by those skilled in the art from the following detailed description of the preferred embodiments with the best mode contemplated for practicing the invention in view of the accompanying drawings.

BRIEF DESCRIPTION OF THE DRAWING

The drawing is an electrical schematic diagram of a current detector according to the invention, shown in a simplified manner in use with an exemplary ignition system.

DETAILED DESCRIPTION OF THE INVENTION

Figure 1:
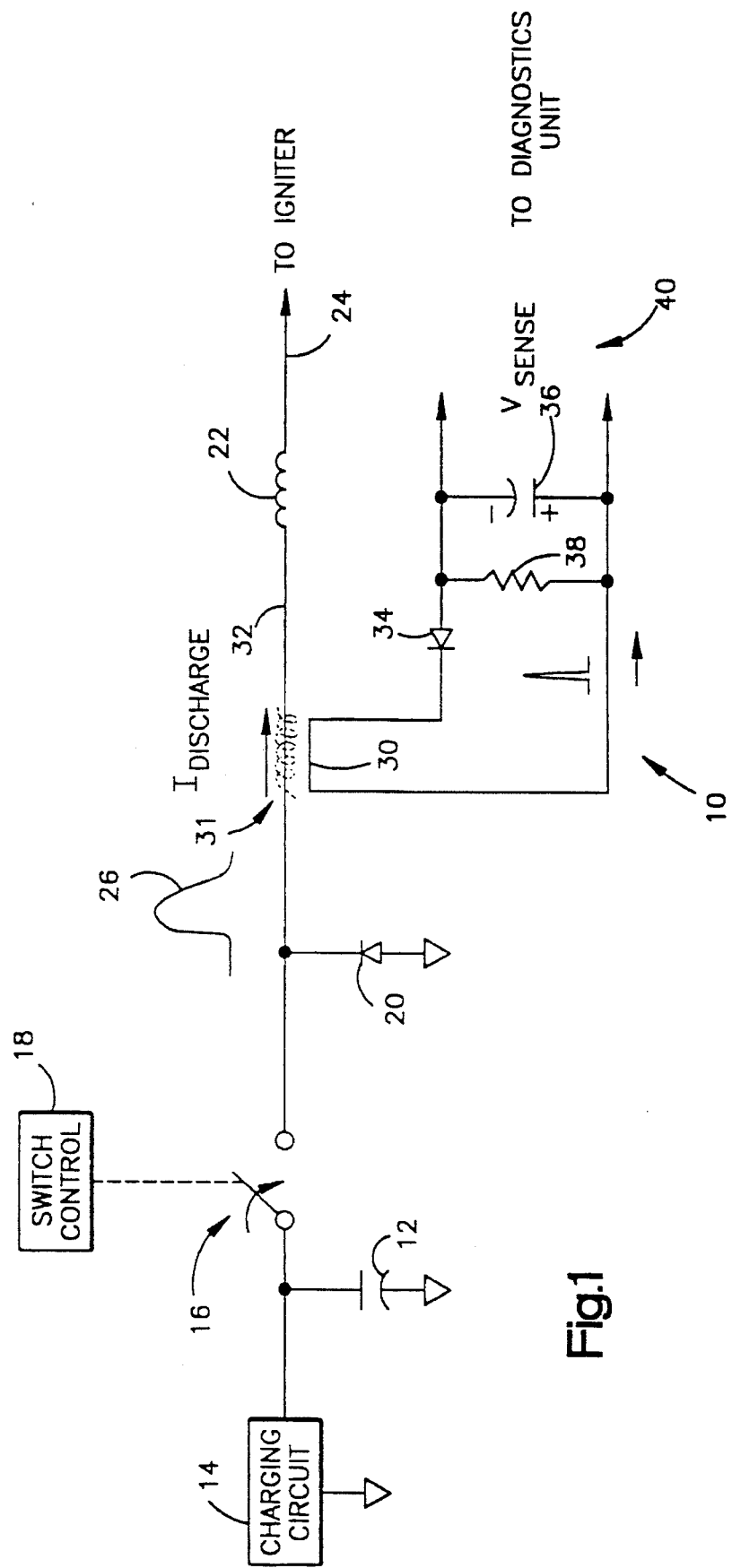

With reference to the drawing, an embodiment of a pulsed current detector according to the present invention is generally indicated with the numeral 10. Although the invention is described herein with respect to a specific embodiment in combination with a specific type of ignition system, this description is intended to be exemplary and should not be construed in a limiting sense. Those skilled in the art will readily appreciate that the advantages and benefits of the invention can be realized with many different types of ignition systems and exciter circuit designs including, but not limited to, unidirectional discharge, oscillatory discharge, AC and/or DC charging systems, capacitive and other discharge configurations, periodic and single shot (e.g. rocket) ignition systems, spark gap and solid-state switching circuits, high tension and low tension discharge circuits, and so on, to name just a few of the many different ignition systems. Furthermore, the invention can be used with ignition systems for many different types of engines, although the description herein is with specific reference to use with a gas turbine engine ignition system particularly suited for use in aerospace applications.

An exemplary low tension exciter circuit is shown in the drawing and includes a main storage capacitor 12 that is connected to a charging circuit 14. The charging circuit 14 can be an AC or DC charger depending on the particular requirements for each application. The charging circuit design can be conventional, such as a DC invertor or a continuous AC supply circuit, for example. The capacitor 12 is also connected to one side of a switch mechanism 16 which for clarity is shown in a representative manner. The switching mechanism can be realized in the form of a spark gap, a gated spark gap, gated solid state switches such as SCR, GTO or MCT devices, either single or cascaded, and so on. The ignition system exciter circuit further includes a control circuit 18 that triggers the switching mechanism at the appropriate times. For example, the control circuit can trigger the switch closed after the capacitor reaches a predetermined charge level, or the circuit can trigger the switch at a predetermined rate based on the desired spark rate. Other timing control scenarios can be used, of course, as is well known to those skilled in the art.

The switching mechanism 16 is also connected to a pulse shaping and output circuit which in this case includes a free wheeling diode 20 and an inductor 22. In this exemplary circuit, the diode 20 forces the discharge current to be unidirectional, such as is typically required for solid state switching mechanisms. The diode can be omitted to produce oscillatory discharge circuits such as are common with spark gap switching devices. The inductor 22 is also connected to the igniter (not shown) and functions to limit the initial current surge through the switch to protect, for example, solid state switches. Other pulse shaping circuits are well known, such as current and/or voltage step-up circuits and distributed or multiplexed output controls, just to name a few examples.

The exciter circuit commonly is connected to the igniter by a conductor, such as a high voltage/current cable lead 24 and a return lead (not shown.) In operation, when the switching mechanism closes after the capacitor is fully charged, the capacitor voltage is impressed across the igniter gap. Assuming the voltage exceeds the breakover voltage of the gap, a plasma or similar conductive path jumps the gap and the capacitor quickly discharges with current rising rapidly as represented by the simplified graph 26 in the drawing. Typical discharge times are on the order of tens of microseconds.

The current discharge pulse can be detected at various points in the ignition circuit. In this case, the detector circuit is shown in use detecting the current through a conductor that connects the inductor to the switch. Alternatively, however, the detector can be used to sense the current through the high tension lead 24 or the return lead, or even at the igniter itself. According to an important aspect of the invention, the detector circuit 10 includes a short conductor or wire 30 that is preferably disposed adjacent to the conductor or other current carrying element at the particular location where pulsed current detection is desired. An advantage of the invention is that this pick-up wire can be positioned as desired and easily moved as desired to different locations in the ignition circuit. The detector 10 can also be realized as a simple add-on feature for the overall system and engine, rather than needing a specific mounting arrangement as is typical with pulse transformers having cores.

The wire 30 can simply be laid parallel and adjacent to or twisted with (as shown in phantom as at 31 in the drawing) the current carrying element of interest, or attached thereto by any convenient means such as a suitable adhesive. This effectively provides an air gap magnetic coupling between the wire 30 and the current carrying element. In the described embodiment, the detector 10 simply provides a go/no-go detection function suitable, for example, with a diagnostic system (not shown.) Therefore, precise control of the magnetic coupling is not required thereby allowing the use of an air gap coupling.

Current through the current carrying element, in this case the conductor 32, induces a sense current in the wire 30 due to the magnetic coupling between the conductors. The wire 10 is connected to a peak current detector realized in the form of a rectifying diode 34 and a capacitor 36. The current induced in the wire 30 is sufficient to charge the capacitor to a few volts; for example, with a capacitor value of 0.1 µf and 1 inch wire, a 520 amp discharge can produce a 17 volt output at ($V_{SENSE}$). Thus, the detector 10 produces an output signal 40 ($V_{SENSE}$) that can be detected by a diagnostic circuit (not shown) or other suitable means (such as a counter or pulse detector, for example) for detecting the discharge event as represented by the output signal 40. The diode 34 blocks discharge of the capacitor 36 due to induced current reversals. A large bleed-off resistor 38 may be provided to discharge the capacitor 36 slowly to allow sufficient sampling time for the diagnostic unit, but to fully discharge the capacitor before the next expected discharge event.

Those skilled in the art will readily appreciate that other current to voltage convertors could be used, or the sense current can be converted to other output signal forms suitable for the particular diagnostics desired. While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

I claim:

1. In combination, a gas turbine engine ignition system exciter, an igniter, a conductor that connects the exciter to the igniter to form a discharge circuit, a current pulse detector for detecting current pulses of an igniter discharge in said discharge circuit, said detector comprising a wire disposed in close proximity to a current carrying element in said circuit so that a sense current is induced, by said current pulses, in said wire across a coreless gap; and a signal conditioning circuit that converts said sense Current to a diagnostic voltage representative of the igniter discharge and that stores said diagnostic voltage for a sampling time period that is less than a discharge interval and long enough for diagnostic detection.

2. The combination of claim 1 wherein said detector comprises a peak current detector that converts said sense current to said diagnostic voltage.

3. The combination of claim 1 further comprising a diagnostics system that uses said output for verifying operational aspects of the exciter and igniter.

4. The combination of claim 1 wherein said conductor is a high tension lead that connects the exciter output to the igniter, and said wire is disposed with a portion thereof parallel and adjacent said lead.

5. The combination of claim 1 wherein said wire is disposed adjacent the igniter to detect current flow through the igniter.

\* \* \* \* \*